(12) United States Patent
Burch

(10) Patent No.: US 6,717,430 B2
(45) Date of Patent: Apr. 6, 2004

(54) INTEGRATED CIRCUIT TESTING WITH A VISUAL INDICATOR

(75) Inventor: Kenneth R. Burch, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 58 days.

(21) Appl. No.: 10/075,047

(22) Filed: Feb. 13, 2002

(65) Prior Publication Data

US 2003/0153105 A1 Aug. 14, 2003

(51) Int. Cl.[7] ............................................. G01R 31/28
(52) U.S. Cl. ........................ 324/765; 324/770; 438/17; 438/18
(58) Field of Search .................... 324/765, 766, 324/767, 768, 769, 770; 438/17, 18

(56) References Cited

U.S. PATENT DOCUMENTS

| | | | |
|---|---|---|---|
| 4,961,053 A | * | 10/1990 | Krug |
| 4,965,515 A | * | 10/1990 | Karasawa |
| 5,399,505 A | | 3/1995 | Dasse et al. |
| 5,504,369 A | | 4/1996 | Dasse et al. |
| 5,594,273 A | | 1/1997 | Dasse et al. |
| 5,654,588 A | | 8/1997 | Dasse et al. |
| 6,114,866 A | * | 9/2000 | Matsuo et al. ............... 324/760 |
| 6,448,802 B1 | * | 9/2002 | Hirt ............................ 324/765 |
| 6,590,410 B2 | * | 7/2003 | Hirt ............................ 324/765 |

OTHER PUBLICATIONS

Lukas W. Snykman et al., "ME2–6", The 4th Pacific Rim Conference on Lasers and Electro–Optics, vol.: 1, 2001, pp. I–108–I–109.

Monuko du Plessis et al., "Silicon Light Emitting Devices In Standard CMOS Technology", Semiconductor Conference 2001 IEEE, CAS 2001 Proceedings, International, vol.: 1, 2001, pp. 231–238.

L.W. Snyman et al., "An Efficient Low Voltage, High Frequency Silicon CMOS Light Emitting Device and Electro–Optical Interface", 1999 IEEE Electron Device Letters, vol. 20, No. 12, Dec., 1999, pp. 614–617.

Monuko du Plessis et al., "A Gate–controlled Silicon Light Emitting Diode", Africon 1999 IEEE, vol. 2, 1999, pp. 1157–1160.

Lukas W. Snyman et al., "Enhanced Light Emission From A Silicon N+PN CMOS Structure", Southeastcon 1999, Proceedings, IEEE, 1999, pp. 242–245.

Lukas W. Snyman et al., "Practical Si LED's With Standard CMOS Technology", Southeastcon 1998, Proceedings, IEEE, 1998, pp. 344–347.

Lukas W. Snyman et al., "Higher–Efficiency Si LED's With Standard CMOS Technology", 1997 Workshop on High Performance Electron Devices for Microwave and Optoelectronic Applications, 1997, EDMO, pp. 340–345.

* cited by examiner

Primary Examiner—M. Wilczewski
(74) Attorney, Agent, or Firm—Robert L. King

(57) ABSTRACT

Wafer level testing is accomplished by using a visual indicator (43) in lieu of a probe machine. Before singulation, each die (52) in a wafer (50) is placed into a test mode and BIST circuitry (39) in each die performs predetermined tests of the other circuits on the die. A pass/fail signal is communicated to a visual indicating device, such as an LED, on the wafer. Each die has a corresponding visual indicator. The LED may be contained either on the die or in the scribe area. Multiple LEDs may be used for multiple circuit modules under test. The test permits easy detection of failures without using probing. Testing such as burn-in may be performed to determine whether a part will survive a range of operating conditions. In one form, a CMOS implementation of an LED may be used in conjunction with a CMOS wafer.

16 Claims, 3 Drawing Sheets

INTEGRATED CIRCUIT TESTING WITH A VISUAL INDICATOR

FIELD OF THE INVENTION

This invention relates generally to semiconductors, and more specifically, to the manufacture and testing of semiconductor devices.

BACKGROUND OF THE INVENTION

In manufacturing integrated circuits and semiconductor die, there are various functional tests that must be performed at different stages of the manufacturing process. One common test that is performed occurs at the point that a plurality of circuits or die has been formed on a single piece of silicon known as a wafer. It is advantageous to test the functionality of the die at this point in order to avoid further processing steps of integrated circuits that are already defective.

In order to provide functionality testing of an integrated circuit, dedicated internal test circuitry, commonly referred to as Built-In Self-Test (BIST) circuitry, is used. Activation of and use of such BIST circuitry is typically performed by using one of two methods. A first method involves the use of a test prober that physically uses probe pins to make contact to each of the die's pads (i.e. inputs/output terminals) for interfacing with the die and its BIST circuitry. The BIST circuitry when activated performs predetermined functional tests of the die's circuitry. Issues previously encountered with probe equipment include the substantial cost of the equipment, the potential for damage to the wafer that the probe procedure may cause, and very importantly, the amount of time required to test each of the die. Typically, probers spend minutes performing the test procedure on each wafer due to the large size of the wafer (i.e. the number of individual die on the wafer) and the time required to test signals to be communicated and analyzed. All of the factors significantly increase the manufacturing costs of an integrated circuit.

A second method of wafer level testing involves the use of the areas on a wafer between the integrated circuit die. The areas are commonly referred to as "streets". A known method of wafer level testing uses conductors that are routed to each of the die. The conductors enable communication (i.e. addressing, test data routing and all other necessary signals such as clocks and power, etc.) with each die. To accomplish the functional communication using the streets, pads also have to be placed in the streets. With these additional conductors, each die may be individually addressed by a prober making contact only in the streets rather than on the individual die. Many of the same disadvantages mentioned above in the probe process equally apply to this test technique. In addition, there is a potential for additional error sources from non-functional conductors placed in the streets resulting from unintentional open circuits or electrical short circuits.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
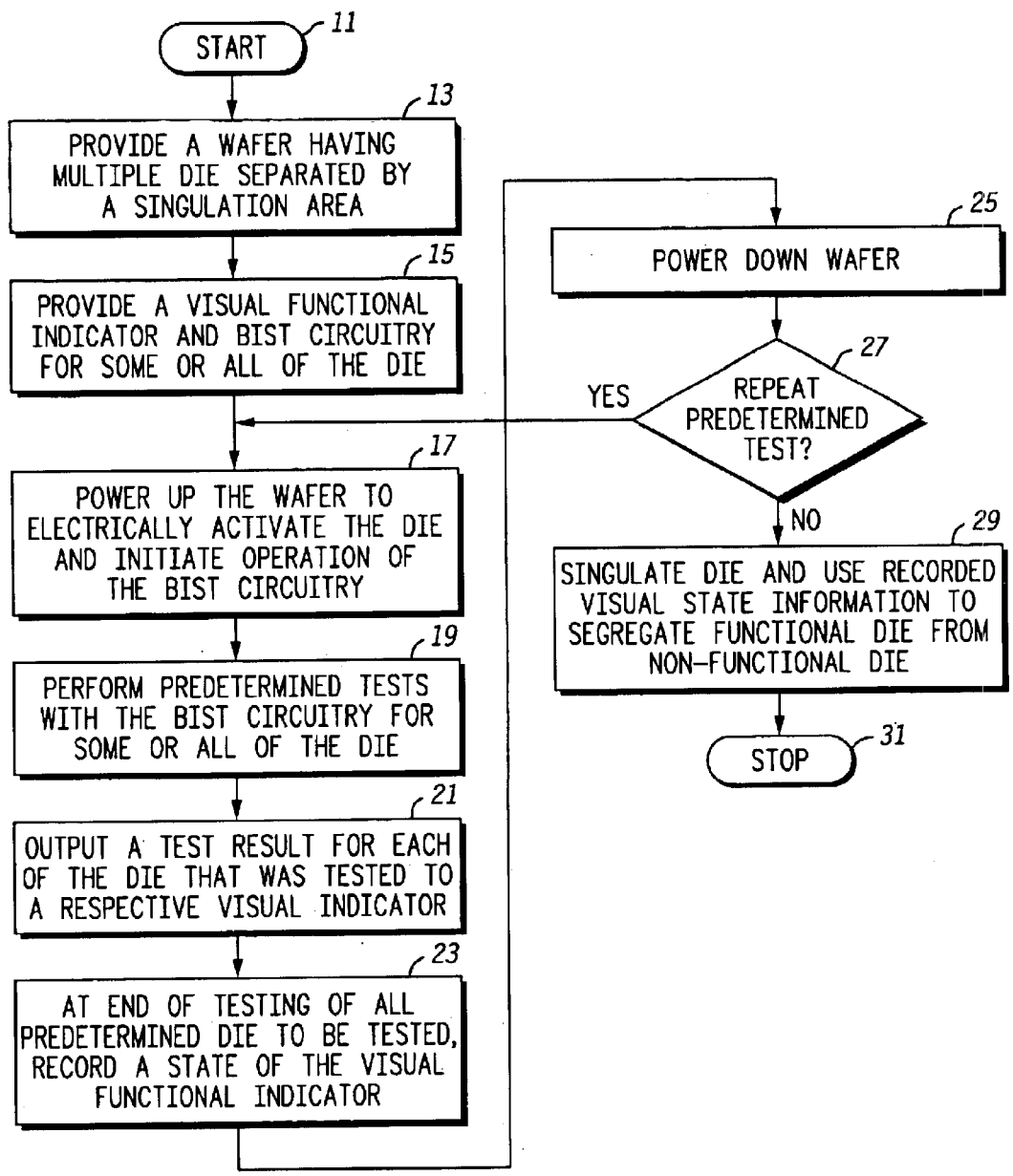
FIG. 1 illustrates in flowchart form integrated circuit testing using a visual indicator in accordance with the present invention.

Illustrated in FIG. 1 is an exemplary flowchart of a methodology for using a visual indicator in connection with testing functionality of integrated circuit die at a test stage of processing, such as at the wafer level. In response to a starting step 11, a wafer is provided having multiple die separated by a singulation area in a step 13. The singulation area is typically a column or row that separates a plurality of die. The singulation area will ultimately be sawed to separate the die prior to individual packaging of the die. Therefore, circuit features that are present in the singulation area will ultimately not be used by an end user.

In a step 15, a visual functional indicator is provided along with Built-In Self-Test (BIST) circuitry for some or all of the die. In other words, not all of the die on a wafer are necessarily the same functionally or visually. Also not all of the die on the wafer may have BIST circuitry. Further, depending upon the application, not all of the die on a wafer will have an associated visual function indicator. The term 'visual function indicator' as used herein is intended to include a variety of devices that provide an optical or visual indication. For example, a light emitting diode that can be readily fabricated in a complementary metal oxide semiconductor (CMOS) process may be used as a visual indicator for indicating whether a predetermined circuit portion or operation is functional. Other devices that can be used include a hot spot that can be created. For example, a short circuit mechanism would provide such a hot area that could be detected visually by an infrared detector. Also, a fusible link can be used if the testing and indicator is only needed once. If the fusible link is implemented with aluminum, the color of the aluminum would change in a manner so that the functional information could be visually detected. Additionally, a micromachined object, such as a mirror or lever, that can be moved to indicate test status may be used to provide a visual indication of a test status. Additionally, explosive silicon materials may be used in one-time applications in which a triggering mechanism is used in response to a test result of a predetermined test procedure.

In a step 17, the wafer is powered up to electrically activate the die and initiate or begin operation of the test circuitry in the form of a BIST circuit or circuitry. There are a number of mechanisms that may be used to initiate the BIST function. For example, the BIST function may be programmed to occur automatically every time that a Power on Reset (POR) operation occurs. Other circuit conditions may be used to trigger or force initiation of a test mode that would invoke the BIST circuitry. Additionally, a test enable signal that is received externally at an input pad may be used to initiate the BIST circuitry.

In a step 19, predetermined tests are performed with the circuitry of the die under control of the BIST circuitry for some or all of the die. Again, it should be noted that not all of the circuits on a wafer may be implemented with BIST circuitry and not all of the BIST circuits are necessarily the same test functions. For example, the tests that will be performed for a memory module of a die will differ from the tests that will be performed for a processor module or some peripheral units that may be on the die. The predetermined tests typically involve the clocking of predetermined input values into inputs of the circuitry under test and analyzing the resulting outputs to determine if an expected output value is obtained.

If the expected output value is obtained, in a step 21 a test result is output by the BIST circuitry for each of the die that was tested to a respective visual indicator. The visual indicator may either be contained within the circuitry of the die or may be external to the die. Also, each visual indicator is specific to a predetermined die.

In a step 23, at the end of testing of all the predetermined die desired to be tested, a state of the visual functional indicator is recorded. This step may be implemented in numerous ways. In one implementation, conventional photography equipment may be used to record by coordinates related to the wafer, the visual status of each of the visual functional indicators. For example, the photography equipment detects whether an LED is lit up or not in response to a BIST operation. The recording both detects the status of the indicator (i.e. asserted or not asserted) and correlates that status to each die. The visual detection is then recorded by a computerized process in which a data base is prepared for subsequent use in the manufacturing process.

In a step 25 a power down operation of the wafer occurs. At this point, the predetermined die of the wafer have been tested, the test result indicated visually, the test result recorded, and the wafer brought back to an inoperative condition with no power applied.

In a step 27, a decision is made as to whether the predetermined tests should be repeated. For example, in some testing procedures, it is desired to test the die repeatedly to try to determine whether or not the die will start to fail at a very early point in the product life. Certain circuitry, such as flash memories, are more susceptible to early product failure than others and the step 27 decision can be patterned depending upon the product application. Another different testing procedure that utilizes repetitive tests is a procedure in which various operating conditions are used to determine a range of operating conditions that the die will be functional in. In other words, the limits of functional operating conditions can be found by subjecting the die to various operating voltages and temperatures. The step 27 may also involve testing known as "burn-in" testing in which the wafer is placed in an oven environment and temperature is varied to determine operability and failure conditions.

If a decision to repeat the tests is made, then steps 17, 19, 21, 23 and 25 are repeated. It should be noted that step 25 may be optional and therefore step 17 is not repeated and the first repeated step is step 19. For some testing conditions, it may not be desired to power down the wafer. Also, it should be noted that different tests or testing may be used when repetition of the steps occurs. The number of repetitions of a test is determined by global software external to the die and wafer controlling the BIST circuitry.

If no repetition of the test is desired, or if after a certain number of repetitions no further repetition is desired, a step 29 is performed. The recorded visual information is used to determine by coordinate position those die on the wafer that have correctly provided the anticipated results of the BIST functional testing. Using that recorded information in electronic form, a die singulation tool singulates the die and segregates the functional die from the non-functional die.

Figure 2:
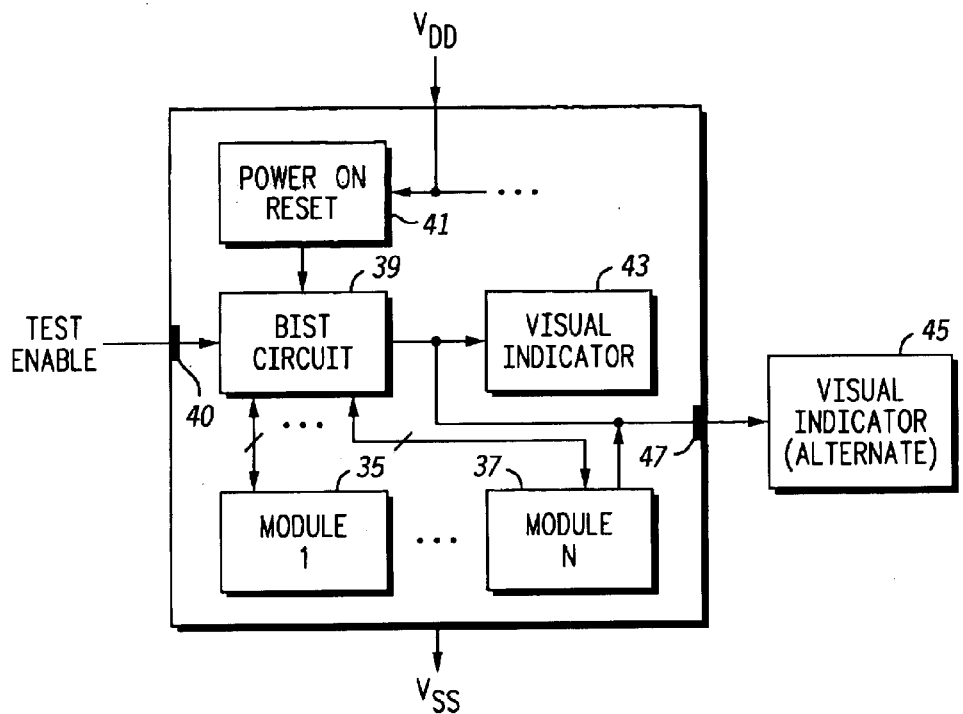
FIG. 2 illustrates in block diagram form an exemplary integrated circuit die using a visual indicator for testing in accordance with the present invention.

Illustrated in FIG. 2 is a detailed block diagram of an exemplary die for use with the methodology of FIG. 1. The die has a plurality of N functional circuit units or modules, such as module 35 through module 37. The value N is an integer and each module provides a predetermined function during a normal operating mode that may be the same or different. A BIST circuit 39 has a plurality of multiple conductor input/output (I/O) conductors connected to each of the modules 35 through 37 for the purpose of probing the modules with predetermined input values and receiving a result signal or a resultant output value from each of the modules 35 through 37 being tested. The BIST circuit 39 has an input for receiving a Test Enable signal at a pad 40 of the die. Instead of receiving an external Test Enable signal from a street of the wafer, the Test Enable signal may also be provided by a probe pin of a prober contacting pad 40. A Power on Reset (POR) circuit 41 is connected to a control input of the BIST circuit 39. The Power on Reset circuit 41 has an input connected to a power supply terminal, labeled $V_{DD}$, for detecting when power is applied to the die. An output of the BIST circuit 39 is connected to an input of a visual indicator 43. An output of module 37 is connected to the input of visual indicator 43. Visual indicator, in one form, is implemented as a light emitting diode (LED) using a conventional CMOS process. In another form, the visual indicator may be implemented as multiple segment BCD (binary coded decimal) LED that indicates any decimal digit. The BCD LED asserts a predetermined decimal upon passing a corresponding predetermined functional test. As such, multiple tests, each associated with a predetermined one of the digit values, may be consecutively run and if any one of the tests failed the digit corresponding to that test would not be asserted and lit up. A camera or a high resolution imager (not shown) records each state of the BCD LED and determine if any of the tests did not get asserted. In yet another form, the LED may be implemented using other materials, such as GaAS. As mentioned above, other visual indicators that can be detected by spectral detection including visual detection. Additionally, rather than detecting an active energy, other detections such as color or explosive silicon may be detected. In an alternative form, the output signal of BIST circuit 39 that is used to provide or activate the visual indicator may instead be connected to a pad 47. In such an event, the output signal of BIST circuit 39 is connected to an input of an external visual indicator 45 that is placed external to the die, such as in a street region of the wafer. An output of module 37 is also connected to the input of external visual indicator 45.

In operation, the BIST circuit 39 is enabled to place the die in a test mode. External global software being executed by a processor external to the wafer determines what functional tests that the die is to be placed in. It should be clear that although FIG. 2 only shows a single die, the testing being described herein is being performed at the wafer level. However, it should also be understood that there is no reason why such test or tests could not be performed additionally after the die has been singulated or for the first time. Further, the wafer containing the die of FIG. 2 may be placed in a burn-in oven or other test environment such as a high radiation environment to test the die in a predetermined controlled environment. It should be noted that not all of the modules 35 through 37 may be tested. In each application, a circuit designer may predetermine which modules need to be tested and interface the BIST circuit 39 accordingly. In one form, modules 35 through 37 represent memory units within a die such as a flash memory, an EEPROM, a DRAM and a ROM. As the test results are provided, the output of BIST circuit 39 indicates whether or not all of the modules have passed the test by provided a desired output value. As illustrated, the indication therefore is a comprehensive pass or fail indicator. However, it should be readily appreciated that if desired, separate visual indicators may be implemented corresponding to either predetermined tests or predetermined circuit portions or modules. In such an embodiment, both of visual indicator 43 and visual indicator 45 are used wherein visual indicator 45 may also be contained on the die so that multiple visual indicators are provided on the same die. For example, in one form visual indicator 43 would indicate the functional test result of module 35 and visual indicator 45 would indicate the functional test result of module 37. Such a test methodology provides enhanced test versatility and refines the visual indication of the source of an error. For example, an easy visual determination may be made regarding what circuit portion of the die fails first. It should be further understood that either of visual indicator 43 or visual indicator 45 may be used for a normal (i.e. non-test) circuit operation of the die of FIG. 2. For example, when the BIST circuit 39 is not enabled, the module 37 may provide an output signal to either of visual indicator 43 or visual indicator 45 as part of an intended function of the die.

Figure 3:
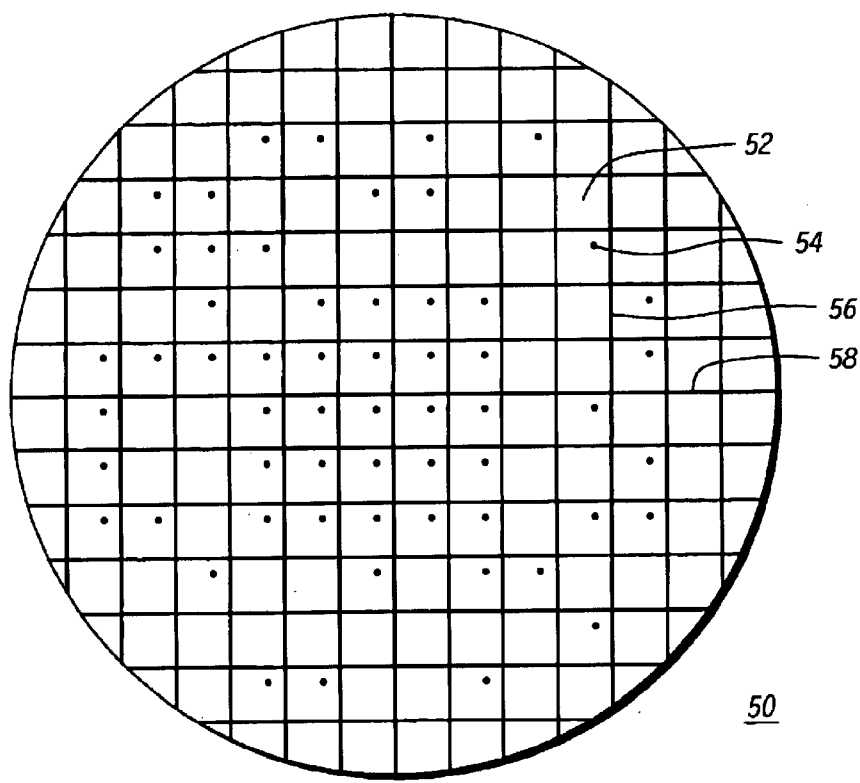
FIG. 3 illustrates in perspective form an integrated circuit wafer using one form of the present invention.

Illustrated in FIG. 3 is a wafer 50 illustrating one form of the visual indicator taught herein wherein each die contains a visual indicator. The wafer 50 has a plurality of die, such as die 52. In modern semiconductor processing, the number of die per wafer may be in the thousands. Therefore, the small number of die illustrated in FIG. 3 is for convenience of illustration only. Each die has a visual indicator contained thereon. However, only a portion of the die is functional and thus only a portion of the visual indicators, such as visual indicator 54, is operating as illustrated in FIG. 3. The wafer has a plurality of vertical streets, such as street 56, and a plurality of horizontal streets, such as street 58. Contained with the streets, such as street 56 and street 58, is the power supply bus as will be detailed below in connection with FIG. 4. The visual indicators of wafer 50 are present for an LED implementation only as long as the wafer's power distribution system is receiving power. Therefore, a computerized recording is made of the position of each of the active die. Once the power is removed from die 52 pursuant to step 25 of FIG. 1, the visual indicators are also removed. In some embodiments, a permanent, one-time visual indicator that is not removed with the removal of power may be utilized.

Figure 4:
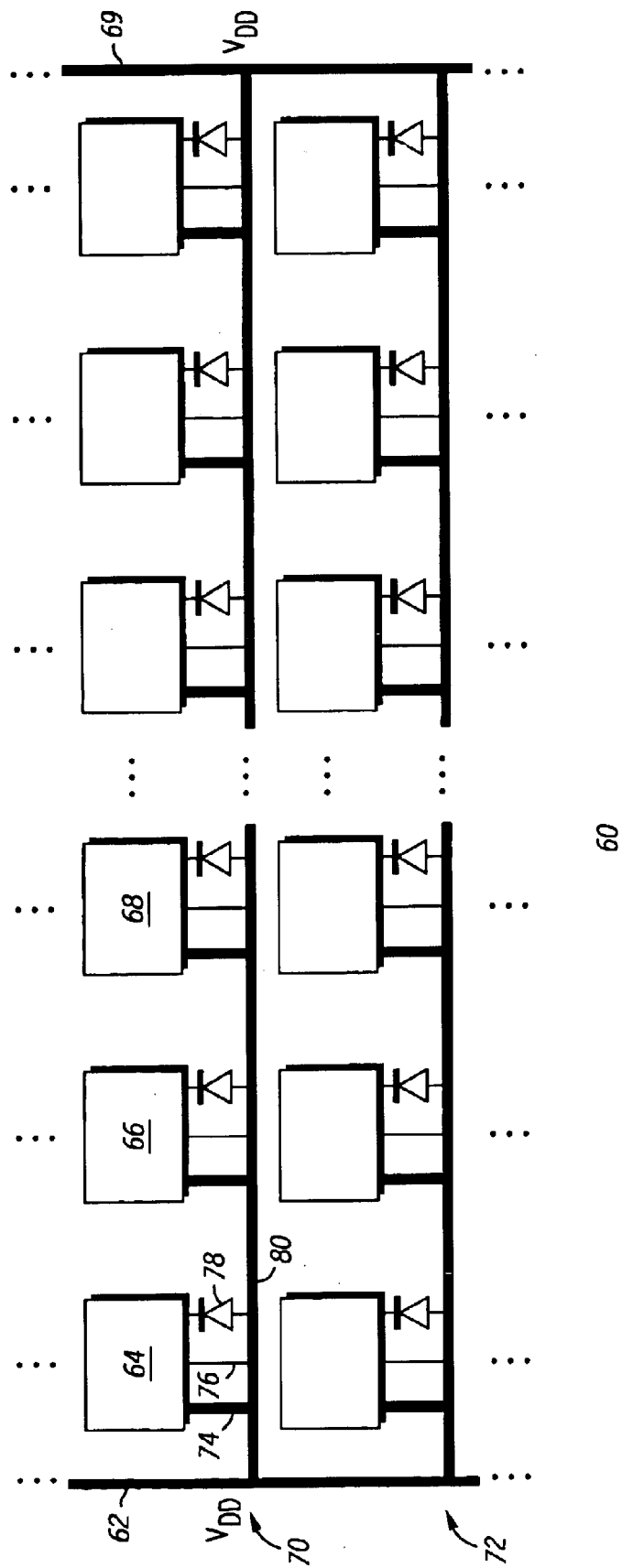
FIG. 4 illustrates a portion of an integrated circuit wafer using another form of the present invention.

Illustrated in greater detail in FIG. 4 is a wafer portion 60 of the wafer 50 of FIG. 3. Contained within the wafer portion 60 is a plurality of die, such as die 64, die 66, die 68, etc. A vertical street to the left of die 64, 66, 68, etc. contains a power supply bus 62 that conducts the power supply voltage $V_{DD}$. A vertical street to the right of die 64, 66, 68, etc. also contains a coupled power supply bus 69 that conducts the power supply voltage $V_{DD}$. Connecting the two vertical streets is a horizontal street 70 and a horizontal street 72. For convenience of explanation, only die 64 will be discussed in detail with horizontal street 70. A polysilicon resistor 74 is connected between a power supply terminal of die 64 and horizontal street 70. The polysilicon resistor 74, and all other analogous resistors in FIG. 4, function to limit current and are used to protect against excessive current flow between each die and the power bus. Should an excessive amount of current be reached, the polysilicon resistor 74 will function as a fuse and blow to isolate the die from the power bus. A signal link 76 is connected between the die 64 and the horizontal street 70. In one form, signal link 76 is analogous to the Test Enable signal of FIG. 2. An LED represented by a diode 78 is connected to the die 64. In one form, diode 78 is analogous to the external visual indicator 45 of FIG. 2.

The wafer level structure of FIG. 4 is advantageous for several additional reasons worth noting. Normally, the amount of power required to power up all of the die on a wafer and performing testing of the die is very significant. As a result, the power bus conductors that must be run along the scribe areas of a wafer (i.e. within the streets) must be as wide as possible in order to conduct the large amount of required current. In prior wafer test systems having address buses and other signal lines present in the scribe lines, the power buses were limited by size to have an inadequate current capacity. In the illustrated form, the entire street is consumed only by a single power bus that can be sized to conduct a significant amount of current. As illustrated, a backside of the wafer is connected to a ground potential, $V_{SS}$. Typically, the backside of the wafer is grounded by placing the backside on a piece of metal, referred to as a chuck, that is connected to a ground potential. In the event the backside of the wafer may not be connected to ground, it should be appreciated that a $V_{SS}$ bus must also be routed in the streets of the wafer.

Another advantage of the wafer level structure of FIG. 4 is that a single open circuit in the $V_{DD}$ power bus will not cause an inability to test each die. For example, assume that at point 80 along the $V_{DD}$ bus there is an open circuit caused by a manufacturing defect when creating the power bus. Because the bus structures of adjacent vertical streets are connected to the bus structures of adjacent horizontal streets, current may be conducted to die 64 and 66 from the left-most vertical power bus of FIG. 4 and current may be conducted to die 68 from the right-most vertical power bus of FIG. 4. Therefore, the wafer level structure taught herein is tolerant to manufacturing defects that may exist within the scribe area.

Another advantage of the wafer level structure of FIG. 4 is that the test enable signal of FIG. 2 may be provided via the signal link 76 at the wafer level from the $V_{DD}$ supply voltage. An internal resistor (not shown) may be used within die 64 to properly scale the value of signal needed to enable the test mode. Therefore, when the wafer is powered up, the die automatically are placed in the test mode and the BIST circuitry becomes enabled. Upon singulating the die, the signal link 76 is destroyed. The BIST circuit 39 of FIG. 2 may optionally contain a forward biased diode (not shown) that is conductive when $V_{DD}$ is connected to pad 40. When the pad 40 of the die of FIG. 2 is no longer connected to $V_{DD}$, the optional diode is no longer conductive and the BIST circuit 39 is not enabled without specific application of a supply voltage to pad 40. It should be understood that in most applications pad 40 may be connected directly to $V_{DD}$ without damage.

By now it should be appreciated that there has been provided a wafer level test method and structure that provides for a fast and inexpensive test methodology that can be performed for all die on a wafer simultaneously without using an expensive prober. Under computer control, power to the wafer can be asserted, the BIST circuitry of each die enabled and controlled to perform predetermined functional tests. The computer further controls either a camera or a high resolution imager to inspect the visual indicators at the correct point in time and record which die were functionally passing. The recorded information is used in a data base by a scribe tool to segregate the functional die from non-functional die. This technique may be applied readily to die on a wafer that uses asynchronous logic or synchronous as timing parameters and constraints do not have to be closely watched in order to implement the functional testing of all the die simultaneously. Whether asynchronous logic or synchronous logic is present on the wafer, the recording of the visual indicators need only be timed a sufficient time after initiation of the BIST testing. Therefore, no additional constraints regarding the timing of when the visual indicators become asserted have to be closely observed to guarantee accurate results. It should be understood that additional testing not described herein of an integrated circuit may be desirable and/or required. However, the method and structure taught herein provide a fast and economical technique to quickly test multiple die on a wafer for functionality.

Although the method and structure taught herein has been disclosed with respect to certain specific steps and materials, it should be readily apparent that various alternatives may be used. For example, instead of using an asserted visual indicator to indicate that the die passed the functional test, a non-asserted visual indicator may be used and an asserted visual indicator used to indicate a fail condition. However, in such an implementation, depending upon the type of visual indicator used, it may not be possible to detect when the visual indicator is faulty and providing an inaccurate indication. Any type of electronic circuit processing may be used in conjunction with the present invention, including bipolar and GaAs circuits.

In the embodiment taught herein wherein the visual indicator is positioned on the die rather than being external, it is possible to additionally use the visual indicator as a signaling device from one die to another. For example, if two die are stacked together such as in a multi-chip module (MCM), it would be possible to use the visual indicator, such as an LED, to transmit information from one die to another if the second die contained a reader to receive the visual information. The presence of the test enable signal to selectively control the test use of the visual indicator prevents the visual indicator from inadvertently becoming operational when normal operation of the die is occurring. Although a plurality of differing operating conditions has been described for conducting tests of multiple die, it should be apparent that such tests may be conducted under only a single operating condition.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for testing an integrated circuit, comprising:
providing a wafer having multiple die that are separated by a singulation area and each containing the integrated circuit;
providing a visual functional indicator for some or all of the multiple die, the visual functional indicator indicating functionality of multiple circuit modules of an associated die and is contained on or adjacent to the associated die;
providing test circuitry on each of the some or all of the multiple die, the test circuitry being dedicated specifically for testing an associated one of the some or all of the multiple die that have a visual functional indicator in response to receiving a test enable signal at an input pad thereof;
powering up the wafer to electrically activate the multiple die and initiate operation of the test circuitry;
performing predetermined tests with the test circuitry for the some or all of the multiple die;
outputting a test result to the visual functional indicator for each of the some or all of the multiple die;
using the test result to create a visual indication on or adjacent the some or all of the multiple die with each visual functional indicator corresponding to the test result; and
recording the visual functional indicator for each of the some or all of the multiple die on or after a fixed predetermined time after receiving the test enable signal.

2. The method of claim 1 further comprising:
physically locating a single visual functional indicator within each of the some or all of the multiple die.

3. The method of claim 1 further comprising:
physically locating the visual functional indicator external to the some or all of the multiple die and within a scribe area of the wafer.

4. The method of claim 1 further comprising:
implementing the visual functional indicator as a light indicating device that provides a predetermined code value indicative of the test result.

5. The method of claim 1 further comprising:
providing a single visual functional indicator for each of the some or all of the multiple die and sequentially testing multiple modules of each of the some or all of the multiple die and sequentially indicating a test result for the multiple modules with the single visual indicator.

6. The method of claim 1 further comprising:
resetting the test circuitry to an initial state in response to powering up the wafer.

7. The method of claim 1 further comprising:
singulating the multiple die and segregating functional die of the multiple die from non-functional die of the multiple die based upon the visual indication.

8. A method for testing an integrated circuit comprising:
providing a wafer having multiple die that are separated by a singulation area;
providing a visual functional indicator for each of some or all of the multiple die;
providing test circuitry for each of the some or all of the multiple die that have a visual functional indicator;
powering up the wafer to electrically activate the multiple die and initiate operation of the test circuitry;
performing predetermined tests with the test circuitry for the some or all of the multiple die;
outputting a test result to the visual functional indicator for the some or all of the multiple die;
using the test result to create a visual indication on the wafer with each visual functional indicator corresponding to the test result; and
implementing the visual functional indicator as a binary coded decimal (BCD) light emitting diode (LED) that asserts a predetermined decimal upon passing a corresponding predetermined functional test.

9. A method for testing an integrated circuit comprising:

providing a wafer having multiple die that are separated by a singulation area;

providing a visual functional indicator for each of some or all of the multiple die;

providing test circuitry for each of the some or all of the multiple die that have a visual functional indicator;

powering up the wafer to electrically activate the multiple die and initiate operation of the test circuitry;

performing predetermined tests with the test circuitry for the some or all of the multiple die;

outputting a test result to the visual functional indicator for the some or all of the multiple die;

using the test result to create a visual indication on the wafer with each visual functional indicator corresponding to the test result; and recording the visual indication with either a camera or a high resolution imager to form a data base that is used by a singulation tool to singulate the multiple die and segregate the multiple die based on the visual indication.

10. A method for testing an integrated circuit, comprising:

providing a wafer having multiple die that are separated by a singulation area;

providing a visual functional indicator for multiple functional modules of each of the multiple die thereby providing a plurality of visual indicators distributed across the wafer;

providing a dedicated built-in self-test (BIST) circuit for each of the multiple die;

powering up the wafer to electrically activate the multiple die and initiate operation of the built-in self-test (BIST) circuit;

performing predetermined tests with the test circuitry for each of the multiple die;

outputting a test result to the visual functional indicator for each of the multiple die; and using the test result to create a visual indication on the wafer with each visual functional indicator corresponding to the test result and providing a predetermined value indicative of the test result.

11. The method of claim 10 further comprising:

using a portion of the plurality of visual indicators for both a test mode of operation and a normal functional mode of operation.

12. The method of claim 10 further comprising:

positioning each respective visual functional indicator within a corresponding respective one of the multiple die.

13. The method of claim 10 further comprising:

implementing each visual functional indicator with a light emitting diode (LED).

14. A method for testing an integrated circuit, comprising:

providing a wafer having multiple die;

providing a visual functional indicator for each of a plurality of the multiple die;

coupling dedicated test circuitry to the visual functional indicator in each of the multiple die that have a visual functional indicator;

powering up the wafer to electrically activate the multiple die and initiate operation of the test circuitry;

enabling the test circuitry with an enable signal applied to an input of each of the plurality of the multiple die;

performing predetermined tests with the test circuitry for each of the plurality of the multiple die;

outputting a test result to each visual functional indicator to visually indicate which die of the multiple die passed the predetermined tests and which die failed the predetermined tests; and using imaging means to inspect each visual functional indicator and record test results.

15. The method of claim 14 further comprising:

physically locating each functional indicator within a scribe area of the wafer.

16. A method for testing an integrated circuit comprising:

providing a wafer having multiple die;

providing a visual functional indicator for each of the multiple die;

providing test circuitry for each of the multiple die that have a visual functional indicator;

powering up the wafer to electrically activate the multiple die and initiate operation of the test circuitry;

performing predetermined tests with the test circuitry for the multiple die;

outputting a test result to each visual functional indicator to visually indicate which die of the multiple die passed the predetermined tests and which die failed the predetermined tests; and recording each visual functional indicator with either a camera or a high resolution imager to form a data base that is used by a singulation tool to singulate the multiple die and segregate the multiple die based on each visual functional indicator.

* * * * *